United States Patent [19]

Kitatani et al.

[11] Patent Number: 5,840,467
[45] Date of Patent: *Nov. 24, 1998

[54] IMAGE RECORDING MATERIALS

[75] Inventors: Katsuji Kitatani; Keitaro Aoshima; Yuichi Shiraishi; Kazuto Kunita; Hiroaki Yokoya, all of Shizuoka, Japan

[73] Assignee: Fuji Photo Film Co., Ltd., Kanagawa, Japan

[*] Notice: This patent issued on a continued prosecution application filed under 37 CFR 1.53(d), and is subject to the twenty year patent term provisions of 35 U.S.C. 154(a)(2).

[21] Appl. No.: 739,064

[22] Filed: Oct. 28, 1996

Related U.S. Application Data

[62] Division of Ser. No. 410,756, Mar. 27, 1995, abandoned.

[30] Foreign Application Priority Data

Apr. 18, 1994 [JP] Japan ................................... 6-078888

[51] Int. Cl.⁶ .............................. G03F 7/30; G03F 7/021; G03F 7/023
[52] U.S. Cl. ...................... 430/302; 430/157; 430/165; 430/176; 430/192; 430/278.1; 430/944
[58] Field of Search ................................ 430/302, 271.1, 430/165, 192, 157, 176, 945, 944, 278.1, 326

[56] References Cited

U.S. PATENT DOCUMENTS

| | | | |
|---|---|---|---|
| 4,299,906 | 11/1981 | Liu | 430/191 |
| 4,334,006 | 6/1982 | Kitajima et al. | 430/192 |
| 4,356,254 | 10/1982 | Takahashi et al. | 430/191 |
| 4,504,566 | 3/1985 | Dueber | 430/192 |
| 4,544,627 | 10/1985 | Takahashi et al. | 430/191 |
| 5,130,223 | 7/1992 | Nishimura et al. | 430/166 |
| 5,200,292 | 4/1993 | Shinozaki et al. | 430/191 |
| 5,631,119 | 5/1997 | Shinozaki et al. | 430/191 |

*Primary Examiner*—John S. Chu
*Attorney, Agent, or Firm*—Sughrue, Mion, Zinn, Macpeak & Seas, PLLC

[57] ABSTRACT

Disclosed is an image recording material which comprises a binder, a substance capable of generating heat by the absorption of light and a heat decomposable substance capable of substantially lowering the solubility of the binder when the substance is in an undecomposed state.

11 Claims, No Drawings

IMAGE RECORDING MATERIALS

This is a Divisional of application Ser. No. 08/410,756 filed Mar. 27, 1995, now abandoned.

FIELD OF THE INVENTION

The present invention relates to image recording materials which can be used as a master plate of offset printing and, more particularly, to positive working photosensitive planographic printing plates suitable for the so-called direct platemaking, or making a printing plate directly from digital signals sent by a computer or the like.

BACKGROUND OF THE INVENTION

With respect to systems suitable for direct platemaking from digital data of a computer, there have hitherto been known (1) a system according to electrophotography, (2) a photopolymerization system utilizing the combination of the exposure to Ar laser with the after-heating, (3) a system using a silver salt photosensitive material provided on photopolymer, (4) a system of silver master type, (5) a system comprising the destruction of a silicone rubber layer with discharge break down or laser beams, and so on.

However, the above-cited systems all have drawbacks as described below: The system (1), in which electrophotography is used, is bothersome in processing because the processing includes the steps of electrification, exposure, development and so on, and requires a complex and large-scale apparatus. The system (2) requires not only the after-heating step but also a highly sensitive plate material, and so it is difficult to handle the plate material under daylight. The systems (3) and (4) require complex processing and high cost for platemaking since a silver salt is used therein. The system (5), on the other hand, is comparatively near to perfection, but has silicone scum on the finished plate surface.

In the meantime, remarkable progress was made in recent development of laser. As a result, it has become easy to obtain high-power solid or semiconductor laser devices of small size, especially those having their emission wavelengths in the region of from near infrared to infrared rays. These laser devices are very useful for the light source of exposure in the direct platemaking from digital data of a computer or the like.

As for the conventional image-recording materials, JP-B-46-27919 (the term "JP-B" as used herein means an "examined Japanese patent publication") discloses the recording material containing in a recording layer a polymeric compound or composition which is insoluble or slightly soluble before heating but can be rendered more soluble in a solvent under the influence of heat, and the method of forming images by heating the aforementioned recording material in accordance with information. On the other hand, JP-A-56-69192 (the term "JP-A" as used herein means an "unexamined published Japanese patent application") discloses the heat-sensitive recording material which has a heat-sensitive layer containing a novolak type phenol resin and carbon black.

Those references, however, disclose nothing but the examples in which images are recorded without using any laser beams. When the direct platemaking from digital data of a computer or the like is carried out by recording images on those recording materials using as the light source of exposure the foregoing laser beams whose emission wavelengths are in the region extending from near infrared to infrared, the thus made plates cannot always provide satisfactory prints because they suffer the generation of scum and the lowering of impression capacity. In order to provide satisfactory prints, it is necessary for recording materials to be easily dissolved in the exposed area (non-image area) and to reside in the unexposed area (image area) when they undergo alkali development after exposure, and further to ensure sufficient durability in the remaining image area.

That is, it is thought that when laser beams are used the above-described known arts cannot provide satisfactory ability to record images, and so the exposed materials have the non-image area hard to dissolve and the image area easy to dissolve.

Accordingly, image recording materials excellent in the ability to record images with laser beams and capable of providing satisfactory prints are demanded.

SUMMARY OF THE INVENTION

An object of the present invention is therefore to provide image recording materials which have high recordability and long press life enough to enable the direct platemaking from digital data of a computer or the like using conventional processing and printing apparatuses without introducing any modification therein.

The above-described object of the invention is attained with image recording materials having the following constitutions of (1) to (14) respectively:

(1) An image recording material which comprises a binder, a substance capable of generating heat by the absorption of light and a heat decomposable substance capable of substantially lowering the solubility of the binder when the substance is in an undecomposed state, (2) An image recording material which comprises a support provided thereon a layer comprising a binder, a substance capable of generating heat by the absorption of infrared rays or near infrared rays and a heat decomposable substance capable of substantially lowering the solubility of the binder when the substance is in an undecomposed state, (3) An image recording material as described in (2), containing an alkali-soluble resin as the binder, (4) An image recording material as described in (2), containing a phenol resin as the binder, (5) An image recording material as described in (2), containing an acrylic resin as the binder, (6) An image recording material as described in (2), containing a polyurethane resin as the binder, (7) An image recording material as described in (2), using a dye as the substance capable of generating heat by the absorption of infrared rays or near infrared rays, (8) An image recording material as described in (2), using a pigment as the substance capable of generating heat by the absorption of infrared rays or near infrared rays, (9) An image recording material as described in (2), using carbon black as the substance capable of generating heat by the absorption of infrared rays or near infrared rays,

(10) An image recording material as described in (2), containing an onium salt as the heat decomposable substance capable of substantially lowering the solubility of the binder when the substance is in an undecomposed state,

(11) An image recording material as described in (2), containing a diazonium salt as the heat decomposable substance capable of substantially lowering the solubility of the binder when the substance is in an undecomposed state,

(12) An image recording material as described in (2), containing a quinonediazide compound as the heat decomposable substance capable of lowering the solubility of the binder when the substance is in an undecomposed state,

(13) An image recording material as described in (2), using a polyester film as the support, and

(14) An image recording material as described in (2), using an aluminum plate as the support.

DETAILED DESCRIPTION OF THE INVENTION

The image forming materials of the present invention are each constituted of a support and a recording layer (photosensitive layer) provided thereon, and the recording layer comprises a binder, a substance capable of generating heat by the absorption of light and a heat decomposable substance capable of substantially lowering the binder solubility in an undecomposed state (hereinafter sometimes referred to as the additive of the present invention).

The incorporation of the additive of the present invention in the recording layer can increase the image strength in the image area and can enlarge a difference between the image area and the non-image area. More specifically, the additive of the present invention can bring about improvements in the solubility of an image-forming binder resin in the non-image area and the insolubility thereof in the image area.

In the present invention, it is desirable that the binder be an alkali-soluble resin from the standpoint of easy formation of images by alkali development, a phenol resin from the standpoint of being easily rendered insoluble by the additive of the present invention, an acrylic resin from the standpoint of having good film-forming properties and forming a highly durable image, or a polyurethane resin from the standpoint of forming an image of high mechanical strength and high durability.

With respect to the substance capable of generating heat by absorption of infrared rays or near infrared rays, it is desirable that the use of a dye can provide a uniform film, the use of a pigment-can provide high heat-generating efficiency, or the use of carbon black can provide high heat-generating efficiency at a low cost.

With respect to the heat decomposable substance capable of substantially lowering the binder solubility in an undecomposed state, it is desirable that the use of an onium can effectively render the binder insoluble, the use of a diazonium salt can effectively render the binder insoluble and it is a highly safe compound, or the use of a quinonediazide compound can effectively render the binder insoluble and it can effectively assist the solubilization of the binder after heat decomposition.

Further, the use of a polyester film as the support is preferred because the polyester film is inexpensive and can contribute to high productivity of image recording materials; while it is preferable for the support to be an aluminum plate in view of the durability and the dimensional stability of an image recording material.

As for the binder, polymers which are more or less soluble in an alkaline developer, although they cannot be dissolved therein with ease, and have affinity to printing ink are used to advantage. As for the substance capable of generating heat by the absorption of light, on the other hand, suitable are those substances capable of generating heat by the absorption of laser beams and decomposing the heat decomposable substance capable of substantially lowering the binder solubility in an undecomposed state by the heat generated, thereby forming an image. Further, as for the heat decomposable substance capable of substantially lowering the binder solubility in an undecomposed state, suitable are those substances which can be decomposed by heat in the exposed area to assist the dissolution of the binder and can lower the solubility of the binder in the unexposed area to increase the durability.

In the aforementioned prior art references, there cannot be found such a clear description that a substance capable of substantially lowering the solubility of a binder is added before heat decomposition, and so it is difficult to analogize therefrom an additive capable of giving substantial insolubleness to a binder, such as an alkali-soluble phenol resin, acrylic resin, polyurethane resin or the like, which are preferred in the present invention.

As a result of further intensive studies, it has been found that various kinds of onium salts, quinonediazide compounds and the like can be suitably used as a heat decomposable substance capable of substantially lowering the binder solubility in an undecomposed state because of their excellent effect upon the lowering of the binder solubility, thereby achieving the present invention.

With respect to onium salts which can be used herein, examples thereof include, e.g., diazonium salts, ammonium salts, phosphonium salts, iodonium salts, sulfonium salts, selenonium salts, arsonium salts.

Suitable examples of onium salts which can be used include the diazonium salts described, e.g., in S. I. Schlesinger, *Photogr. Sci. Eng.*, 18, 387 (1974), T. S. Bal et al., *Polymer*, 21, 423 (1980), JP-A-5-158230; the ammonium salts disclosed, e.g., in U.S. Pat. Nos. 4,069,055, 4,069,056, JP-A-3-140140; the phosphonium salts described, e.g., in D. C. Necker et al., *Macromolecules*, 17, 2468 (1984), C. S. Wen et al., *Teh. Proc. Conf. Rad. Curing ASIA*, p 478, Tokyo, October (1988), U.S. Pat. Nos. 4,069,055 and 4,069,056; the iodonium salts described, e.g., in J. V. Crivello et al., *Macromolecules*, 10(6), 1307 (1977), *Chem. & Eng. News*, November 28, p 31 (1988), European Patent No. 104,143, U.S. Pat. Nos. 339,049 and 410,201, JP-A-2-140848, JP-A-2-296514; the sulfonium salts described, e.g., in J. V. Crivello et al., *Polymer J.*, 17, 73 (1985), J. V. Crivello et al., *J. Org. Chem.*, 43, 3055 (1978), W. R. Watt et al., *J. Polymer Sci.*, Polymer Chem. Ed., 22, 1789 (1984), J. V. Crivello et al., *Polymer Bull.*, 14, 279 (1985), J. V. Crivello et al., *Macromolecules*, 14(5), 1141 (1981), J. V. Crivello et al., *J. Polymer Sci.*, Polymer Chem. Ed., 17, 2877 (1979), European Patent Nos. 370,693, U.S. Pat. No. 3,902,114, European Patent Nos. 233,567, 297,443 and 297,442, U.S. Pat. Nos. 4,933,337, 410,201, 339,049, 4,760,013, 4,734,444 and 2,833,827, German Patent Nos. 2,904,626, 3,604,508 and 3,604,581; the selenonium salts described, e.g., in J. V. Crivello et al., *Macromolecules*, 10(6), 1307 (1977), J. V. Crivello et al., *J. Polymer Sci.* Polymer Chem. Ed., 17, 1047 (1979); and the arsonium salts described, e.g., in C. S. Wen et al., *Teh. Proc. Conf. Rad. Curing ASIA*, p 478, Tokyo, October (1988).

Of these onium salts, diazonium salts are preferred over the others. In particular, the diazonium salts disclosed in JP-A-5-158230 are used to advantage.

As for the quinonediazides which can be suitably used herein, o-quinonediazide compounds are examples thereof.

Specifically, the o-quinonediazide compounds used in the present invention are those compounds containing at least one o-quinonediazido group, although they may have a wide variety of structures, and having such a property that their solubilities in an alkali can be increased by heat decomposition. In other words, the o-quinonediazide compounds lose their ability to inhibit the dissolution of a binder when they undergo heat decomposition, and they themselves are converted to alkali-soluble substances. By virtue of both the properties described above, the o-quinonediazide compounds can improve upon the dissolution properties of a photosensitive system. More specifically, the compounds described, e.g., in J. Kosar, *Light-Sensitive Systems,* pp. 339–352, John Wiley & Sons Inc. can be used as the o-quinonediazide compound for the present invention. In particular, o-quinonediazide sulfonic acid eaters or o-quinonediazide sulfonic acid amides obtained by the reaction with various kinds of aromatic polyhydroxy compounds or aromatic amino compounds are suitable for the present invention. Also, there can be suitably used the ester of benzoquinone-(1,2)-diazidosulfonic acid chloride or naphthoquinone-(1,2)-diazido-5-sulfonic acid chloride and a pyrogallol-acetone resin, as disclosed, e.g., in JP-B-43-28403, and the ester of benzoquinone-(1,2)-diazidosulfonic acid chloride or naphthoquinone-(1,2)-diazido-5-sulfonic acid chloride and a phenol-formaldehyde resin, as disclosed, e.g., in U.S. Pat. Nos. 3,046,120 and 3,188,210.

Further, the ester of naphthoquinone-(1,2)-diazido-4-sulfonic acid chloride and a phenol-formaldehyde resin or a cresol-formaldehyde resin, and the ester of naphthoquinone-(1,2)-diazido-4-sulfonic acid chloride and a pyrogallol-acetone resin can be also used to advantage. Other useful o-quinonediazide compounds include those disclosed and known in a great number of patent documents. For instance, there can be cited the o-quinonediazide compounds disclosed, e.g., in JP-A-47-5303, JP-A-48-63802, JP-A-48-63803, JP-A-48-96575, JP-A-49-38701, JP-A-48-13354, JP-B-41-11222, JP-B-45-9610, JP-B-49-17481, U.S. Pat. Nos. 2,797,213, 3,454,400, 3,544,323, 3,573,917, 3,674,495 and 3,785,825, U.K. Patents 1,227,602, 1,251,345, 1,267,005, 1,329,888 and 1,330,932, German Patent No. 854,890.

It is desirable that an o-quinonediazide compound used in the present invention be added in an amount of 1 to 50% by weight, preferably 5 to 30% by weight, and particularly preferably 10 to 30% by weight, based on the whole solid contents in the photosensitive composition. These compounds as cited above can be used alone or as a mixture of several kinds. When the amount of the o-quinonediazide compound added is below 1% by weight, the ability to record images is deteriorated; while when it is increased beyond 50% by weight, the durability in the image area is deteriorated and the sensitivity is lowered.

Specific examples of counter ions of the onium salts include, e.g., tetrafluoroborate ion, hexafluorophosphate ion, triisopropylnaphthalenesulfonate ion, 5-nitro-o-toluenesulfonate ion, 5-sulfosalicylate ion, 2,5-dimethylbenzenesulfonate ion, 2,4,6-trimethylbenzenesulfonate ion, 2-nitrobenzenesulfonate ion, 3-chlorobenzensulfonate ion, 3-bromobenzenesulfonate ion, 2-fluorocaprylnaphthalenesulfonate ion, dodecylbenzenesulfonate ion, 1-naphthol-5-sulfonate ion, 2-methoxy-4-hydroxy-5-benzoylbenzenesulfonate ion and p-toluenesulfonate ion. Of these counter ions, hexafluorophosphate ion and alkylarylsulfonate ions such as triisopropylnaphthalenesulfonate ion and 2,5-dimethylbenzenesulfonate ion are particularly preferred.

The addition amount of the other additives of the present invention than o-quinonediazide compounds is in an amount of preferably from 1 to 50% by weight, more preferably from 5 to 30% by weight and particularly preferably from 10 to 30% by weight.

It is desirable that the additive of the present invention and the binder be incorporated in the same layer.

As for the substance capable of generating heat by the absorption of light, various types of pigments or dyes can be used.

The pigments which can be used in the present invention include commercially available pigments and the pigments described, e.g., in Color Index Handbook, "Saishin Ganryo Binran" (which means "Newest Pigments Handbook") compiled by Nippon Ganryo Gijutsu Kyokai in 1977, "Saishin Ganryo Ohyo Gijutsu" (which means "Application arts of Newest Pigments") published by CMC Shuppan in 1986, "Insatsu Ink Gijutsu" (which means "Printing Ink Arts") published by CMC Shuppan in 1984.

With respect to what types of pigment can be used, black pigments, yellow pigments, orange pigments, brown pigments, red pigments, violet pigments, blue pigments, green pigments, fluorescent pigments, metallic powder pigments and polymer-bonded dyes can be instanced. Specific examples of pigments which can be used include, e.g., insoluble azo pigments, azo lake pigments, condensed azo pigments, chelated azo pigments, phthalocyanine pigments, anthraquinone pigments, perylene and perinone pigments, thioindigo pigments, quinacridone pigments, dioxazine pigments, isoindolinone pigments, quinophthalone pigments, dyeing lake pigments, azine pigments, nitroso pigments, nitro pigments, natural pigments, fluorescent pigments, inorganic pigments and carbon black.

These pigments may be used without undergoing any surface treatment, or may be used after a certain surface treatment. The surface treatment methods which can be adopted include, e.g., a method of coating the pigment surface with a resin or wax, a method of making a surfactant adhere to the pigment surface and a method of bonding a reactive substance (e.g., a silane coupling agent, an epoxy compound, polyisocyanate) to the pigment surface. The surface treatment methods as cited above are described, e.g., in "Kinzoku Sekken no Seishitsu to Ohyo" (which means "Properties and Application of Metallic Soaps") published by Saiwai Shobo, "Insatsu Ink Gijutsu" (which means "Printing Ink Arts") published by CMC Shuppan in 1984, "Saishin Ganryo Ohyo Gijutsu" (which means "Application arts of Newest Pigments") published by CMC Shuppan in 1986.

The particle size of such a pigment as cited above ranges preferably from 0.01 $\mu$m to 10 $\mu$m, more preferably from 0.05 $\mu$m to 1 $\mu$m, and particularly preferably from 0.1 $\mu$m to 1 $\mu$m. It is undesirable for the pigment to have a particle size smaller than 0.01 $\mu$m from the standpoint of the stability of the pigment dispersion in a coating composition of a photosensitive layer. Also, it is undesirable for the pigment to have a particle size greater than 10 $\mu$m from the viewpoint of the uniformity of the photosensitive layer.

In the method of dispersing pigments, there can be adopted known dispersing arts which have so far been used for the production of ink and toner. Suitable examples of a dispersing machine which can be used include, e.g., a ultrasonic disperser, a sand mill, an attritor, a pearl mill, a super mill, a ball mill, an impeller, a disperser, a KD mill, a colloid mill, a dynatron, a triple roll mill, a pressure kneader. Further details of dispersing arts are described, e.g., in "Saishin Ganryo Ohyo Gijutsu" (which means "Application Arts of Newest Pigments") published by CMC Shuppan in 1986.

As for the dyes, there can be used commercially available dyes and known dyes described in references (e.g., "Senryo Binran" (which means "Handbook of Dyes") compiled by Yuki Gousei Kagaku Kyokai (1970)). Specifically, dyes which can be used include, e.g., azo dyes, metal complex azo dyes, pyrazolone azo dyes, anthraquinone dyes, phthalocyanine dyes, carbonium dyes, quinoneimine dyes, methine dyes, cyanine dyes.

Of the pigments and dyes as cited above, those which can absorb infrared rays or near infrared rays are particularly preferred over the others in view of the suitability for utilization of laser devices emitting infrared or near infrared rays.

As for the pigment which can absorb infrared or near infrared rays, carbon black is used to advantage. As suitable examples of dyes which can absorb infrared or near infrared rays, mention may made of, e.g., the cyanine dyes disclosed, e.g., in JP-A-58-125246, JP-A-59-84356, JP-A-59-202829 and JP-A-60-78787, the methine dyes disclosed, e.g., in JP-A-58-173696, JP-A-58-181690 and JP-A-58-194595, the naphthoquinone dyes disclosed, e.g., in JP-A-58-112793, JP-A-58-224793, JP-A-59-48187, JP-A-59-73996, JP-A-60-52940 and JP-A-60-63744, the squalylium dyes disclosed, e.g., in JP-A-58-112792, the cyanine dyes disclosed in U.K. Patent 434,875.

Further, the near infrared absorption sensitizers disclosed, e.g., in U.S. Pat. No. 5,156,938 are suitably used as the dyes, and the substituted arylbenzo(thio)pyrylium salts disclosed, e.g., in U.S. Pat. No. 3,881,924, the trimethinethiapyrylium salts disclosed, e.g., in JP-A-57-142645 (corresponding to U.S. Pat. No. 4,327,169), the pyrylium compounds disclosed, e.g., in JP-A-58-181051, JP-A-58-220143, JP-A-59-41363, JP-A-59-84248, JP-A-59-84249, JP-A-59-146063, JP-A-59-146061, the cyanine dyes disclosed, e.g., in JP-A-59-216146, the pentamethinethiopyrylium salts disclosed, e.g., in U.S. Pat. No. 4,283,475 and the pyrylium compounds disclosed, e.g., in JP-B-5-13514 and JP-B-5-19702 are used to particular advantage.

Furthermore, the near infrared absorbing dyes described as those having the formulae (I) and (II) respectively in U.S. Pat. No. 4,756,993 can be cited as other examples of dyes which are particularly preferred.

These pigments or dyes can be added to a photosensitive composition in an amount of 0.01 to 50% by weight, preferably 0.1 to 10% by weight, based on the whole solid contents in the photosensitive composition. In particular, it is effective to add dyes in an amount of 0.5 to 10% by weight or pigments in an amount of 3.1 to 10% by weight to a photosensitive composition. When the amount of pigments or dyes added is less than 0.01% by weight, the sensitivity becomes low, while when it is increased beyond 50% by weight, the uniformity of the photosensitive layer is lost and the durability of the recording layer is deteriorated.

These pigments or dyes may be added to the same layer which other ingredients are added to, or a different layer may be provided for the incorporation thereof. In the latter case, it is desirable to be added in an adjacent layer to the layer containing the heat decomposable substance capable of substantially lowering the binder solubility in an undecomposed state of the present invention. Additionally, it is desirable that dyes or pigments and a binding resin be contained in the same layer, but they may be contained in separate layers.

As for the binder, water-insoluble, alkaline water-soluble resins are used to advantage. Although any resins can be used so far as they have properties as described above, the following novolak resins are preferable.

For instance, a phenol-formaldehyde resin, a m-cresol-formaldehyde resin, p-cresol-formaldehyde resin, an o-cresol-formaldehyde resin, a m-cresol/p-cresol mixture-formaldehyde resin and phenol/cresol mixture-formaldehyde resins (wherein the cresol may be m-cresol, p-cresol, o-cresol or a m-cresol/p-cresol mixture, a m-cresol/o-cresol mixture or a o-cresol/p-cresol mixture) can be cited.

Although other phenol resins of resol type are also suitable for the binder, phenol/cresol mixture-formaldehyde resins (wherein the cresol may be m-cresol, p-cresol, o-cresol or a m-cresol/p-cresol mixture, a m-cresol/o-cresol mixture or a o-cresol/p-cresol mixture) are preferable, and the phenol resins disclosed in JP-A-61-217034 are particularly favored.

In addition, there can be used various kinds of alkali-soluble high molecular weight compounds such as phenol-modified xylene resins, polyhydroxystyrenes, poly(halogenated hydroxystyrene)s, the acrylic resins containing phenolic hydroxy groups as disclosed, e.g., in JP-A-51-34711, the acrylic resins containing sulfonamido groups as disclosed, e.g., in JP-A-2-866 and urethane resins.

Of these high molecular weight compounds, the sulfonamido group-containing acrylic resins are particularly preferred.

AB for the urethane resins, those disclosed, e.g., in JP-A-63-124047, JP-A-63-261350, JP-A-63-287942, JP-A-63-287943, JP-A-63-287944, JP-A-63-287946, JP-A-63-287947, JP-A-63-287948, JP-A-63-287949, JP-A-1-134354 and JP-A-1-255854 are used to advantage.

It is desirable for those alkali-soluble high molecular weight compounds to have a weight average molecular weight of from 500 to 200,000 and a number average molecular weight of from 200 to 60,000.

Such alkali-soluble high molecular weight compounds may be used alone or as a combination of two or more thereof. They are added in an amount of from 5 to 99% by weight, preferably from 10 to 90% by weight and particularly preferably from 20 to 80% by weight, based on the whole solid contents in the photosensitive composition. When the amount of alkali-soluble high molecular weight compounds added is less than 5% by weight, the resulting recording layer is poor in durability; while when the amount is increased beyond 99% by weight, both the sensitivity and the durability are unsatisfactory.

To the positive photosensitive compositions of the present invention, various additives can further be added, if needed.

For instance, the addition of the condensate products of formaldehyde and a phenol substituted with an alkyl group containing 3 to 8 carbon atoms, such as an octylphenolformaldehyde resin, is desirable from the standpoint of an improvement in ink-receptivity of the image formed.

Further, cyclic acid anhydrides, phenols or organic acids can be added for the purpose of enhancing the sensitivity. As for the cyclic acid anhydrides, there can be used, e.g., phthalic anhydride, tetrahydrophthalic anhydride, hexahydrophthalic anhydride, 3,6-endoxy-$\Delta^4$-tetrahydrophthalic anhydride, tetrachlorophthalic anhydride, maleic anhydride, chloromaleic anhydride, α-phenylmaleic anhydride, succinic anhydride, pyromellitic anhydride. As examples of phenols, mention may be made of, e.g., bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, 4,4',3",4"-tetrahydroxy-3,5,3',5'-tetramethyltriphenylmethane. As for the organic acids, on the other hand, those disclosed, e.g., in JP-A-60-88942, JP-A-2-96755, including sulfonic acids, sulfinic acids, alkylsulfates, phosphonic acids, phosphates, carboxylic acids, are examples thereof. More specifically, there can be used, e.g., p-toluenesulfonic acid, dodecylbenzenesulfonic acid, p-toluenesulfinic acid, ethyl sulfate, phenylphosphonic acid, phenylphosphinic acid, phenyl phosphate, diphenyl phosphate, benzoic acid, isophthalic acid, adipic acid, p-toluylic acid, 3,4-dimethoxybenzoic acid, phthalic acid, terephthalic acid, 4-cyclohexene-1,2-dicarboxylic acid, erucic acid, lauric acid, n-undecanic acid, ascorbic acid.

It is desirable for the foregoing cyclic acid anhydrides, phenols and organic acids to be added in an amount of 0.05 to 20% by weight, preferably 0.1 to 15% by weight and particularly preferably 0.1 to 10% by weight, based on the photosensitive composition.

To the photosensitive compositions of the present invention, the nonionic surfactants as disclosed, e.g., in JP-A-62-251740, JP-A-3-208514 and the amphoteric surfactants as disclosed, e.g., in JP-A-59-121044, JP-A-4-13149 can further be added for the purpose of enhancing the processing stability to variation in developing condition.

Specific examples of a nonionic surfactant which can be added include, e.g., sorbitan tristearate, sorbitan monopalmitate, sorbitan trioleate, stearic acid monoglyceride, polyoxyethylene nonylphenyl ether.

Specific examples of an amphoteric surfactant which can be used include, e.g., alkyldi(aminoethyl)glycines, alkylpolyaminoethylglycine hydrochlorides, 2-alkyl-N-carboxyethyl-N-hydroxyethylimidazolinium betaines, N-tetradecyl-N,N-betaines (e.g., Amogen K, trade name, the product of Dai-ichi Kogyo K.K.).

It is desirable that the amount of the foregoing nonionic and amphoteric surfactants is in an amount of 0.05 to 15% by weight, preferably 0.1 to 5% by weight, based on the photosensitive composition.

To the photosensitive compositions of the present invention can be further added a printing-out agent for forming visible images immediately after heating by exposure or a dye and a pigment as image coloring agent.

As for the printing-out agent, combinations of compounds capable of releasing acids upon heating by exposure (photoacid releasor) with organic dyes capable of forming salts are typical examples thereof. Specifically, there can be used, e.g., the combinations of o-naphthoquinonediazido-4-sulfonic acid halogenides with salt-forming organic dyes, as disclosed, e.g., in JP-A-50-36209, JP-A-53-8128; and the combinations of trihalomethyl compounds with salt-forming organic dyes, as disclosed, e.g., in JP-A-53-36223, JP-A-54-74728, JP-A-60-3626, JP-A-61-143748, JP-A-61-151644, JP-A-63-58440. Such trihalomethyl compounds include the compounds of oxazole type and triazine type. Both types have high ageing stability, and can provide clear print-out images.

As for the image coloring agent, other dyes in addition to the foregoing salt-forming organic dyes can be used. Suitable dyes, inclusive of salt-forming organic dyes, are oil-soluble dyes and basic dyes. As specific examples thereof, mention may be made of, e.g., Oil Yellow #101, Oil Yellow #103, Oil Pink #312, Oil Green BG, Oil Blue BOS, Oil Blue #603, Oil Black BY, Oil Black BS and Oil Black T-505 (which are the products of Orient Chemical Industry Co., Ltd.); and further, Victoria Pure Blue, Crystal Violet (CI42555), Methyl Violet (CI42535), Ethyl Violet, Rhodamine B (CI145170B), Malachite Green (CI42000), Methylene Blue (CI52015). Also, the dyes disclosed in JP-A-62-293247 are especially favored. These dyes can be added to a photosensitive composition in an amount of 0.01 to 10% by weight based on the whole solid contents in the photosensitive composition.

In addition to the aforementioned additives, a plasticizer may be optionally added to the photosensitive compositions of the present invention for the purpose of giving softness and the like to the films formed therefrom. Specific examples of a plasticizer which can be used therein include, e.g., butylphthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, oligomers and polymers of acrylic or methacrylic acid.

Each of the image recording materials of the present invention can be generally prepared by dissolving the above-described various components in an appropriate solvent and applying the resulting solution to a proper support. As examples of a solvent which can be used herein, mention may be made of, e.g., ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene. However, the invention should not be construed as being limited to those solvents. These solvents are used alone or as a mixture of two or more thereof. The concentration of the foregoing components (whole solid contents, inclusive of the additives) in the solvent is preferably in the range of 1 to 50% by weight. Although the coverage rate (solid contents) on a support, which is attained by coating and drying, should be determined depending on the end-use purpose, it is desirably in the range of 0.5 to 5.0 g/m$^2$ in the case of a photosensitive printing plate. As for the coating method, various methods can be adopted herein, including, e.g., a bar coater coating method, a spin coating method, a spray coating method, a curtain coating method, a dip coating method, an air knife coating method, a blade coating method, a roll coating method. In proportion as the coverage rate becomes lower, the apparent sensitivity becomes higher, but the film properties of the photosensitive film become worse.

In the photosensitive layers according to the present invention, surfactants for improvements of coating properties, e.g., the fluorine-containing surfactants as disclosed, e.g., in JP-A-62-170950, can be contained. It is desirable for such surfactants to be added in an amount of 0.01 to 1% by weight, preferably 0.05 to 0.5% by weight, based on the whole photosensitive composition. As for the support, dimensionally stable plate-form materials can be used in the present invention. Specific examples thereof include, e.g., plain paper, papers laminated with plastics (e.g., polyethylene, propylene, polystyrene), metal plates (e.g., aluminum plate, zinc plate, copper plate), plastic films (e.g., cellulose diacetate film, cellulose triacetate film, cellulose propionate film, cellulose butyrate film, cellulose acetate butyrate film, cellulose nitrate film, polyethylene terephthalate film, polyethylene film, polystyrene film, polypropylene film, polycarbonate film, polyvinyl acetal film), the papers or films on which metals as cited above are laminated or vacuum-deposited.

As the support used in the present invention, a polyester film and an aluminum plate are preferred over the others. In particular, an aluminum plate is used to advantage because of its high dimensional stability and relatively low price.

A suitable aluminum plate is a pure aluminum plate or a plate of aluminum alloy containing aluminum as a main component and a trace amount of foreign atoms. Also, an aluminum-laminated or aluminum-deposited plastic film may serve the purpose. As for the foreign atoms contained in the aluminum alloy, silicon, iron, manganese, copper, magnesium, chromium, zinc, bismuth, nickel and titanium are examples thereof. In the aluminum alloy, the foreign atoms are contained in an amount of at most 10% by weight. Although pure aluminum is especially favored in the present invention, it is difficult to obtain perfectly pure aluminum in view of refining arts. Accordingly, trace amounts of foreign metals may be contained in the aluminum used. Thus, the composition of an aluminum plate applicable to the present invention cannot be specified, and the aluminum plate for the present invention can be chosen properly from hitherto known, commonly used aluminum plates. The thickness of an aluminum plate used in the present invention is of the range of 0.1 to 0.6 mm, preferably in the range of 0.15 to 0.4 mm, and particularly preferably in the range of 0.2 to 0.3 mm.

Prior to the surface roughening treatment, the aluminum plate is optionally subjected to a degreasing treatment with a surfactant, an organic solvent or an aqueous alkaline solution in order to remove a rolling oil from the surface of the aluminum plate.

As for the surface roughening treatment, the surface of an aluminum plate can be roughened using various methods, including, e.g., a method of mechanically roughening the surface, a method of electrochemically dissolving the surface, a method of performing selective dissolution of the surface with a chemical means. As for the method of mechanically roughening the surface, known methods as called a ball abrasion method, a brush abrasion method, a blast abrasion method, a buff abrasion method and so on can be used. As for the method of electrochemically roughening the surface, there is a method of conducting the roughening using a direct or alternating current in a hydrochloric or nitric acid electrolyte. In addition, the both the above-cited mechanically and electrochemically roughening methods may be used in combination, as disclosed in JP-A-54-63902.

The thus surface-roughened aluminum plate undergoes an alkali etching treatment and a neutralizing treatment, if needed. Thereafter, the aluminum plate is subjected to an anodizing treatment, if desired, for the purpose of enhancing the water-holding ability and abrasion resistance of the surface. In the anodizing treatment of an aluminum plate, various electrolytes capable of forming a porous oxidized coat can be used. In general, sulfuric acid, phosphoric acid, oxalic acid, chromic acid or a mixture of two or more thereof is used as the electrolyte. The concentration of electrolyte used can be properly determined depending on the species thereof. Further, the condition of the anodizing treatment can be varied variously depending on the electrolyte used, and so it is impossible to absolutely specify the condition. In general, however, effective anodizing can be achieved so far as the concentration of an electrolytic solution used is in the range of 1 to 80% by weight, the solution temperature in the range of 5° to 70° C., the electric current density in the range of 5 to 60 A/dm$^2$, the voltage in the range of 1 to 100 V, the electrolysis time in the range of 10 seconds to 50 minutes.

If the amount of the anodized coat is less than 1.0 g/m$^2$, the press life is insufficient and the non-image part of the planographic printing plate tends to be scratched to result in generation of the so-called scratch stain, or staining the scratched part with ink upon printing. After the anodizing treatment, the surface of the aluminum plate is subjected to a hydrophilic treatment, if desired. The hydrophilic treatment can be effected using an alkali metal silicate (e.g., an aqueous solution of sodium silicate) process, as disclosed in U.S. Pat. Nos. 2,714,066, 3,181,461, 3,280,734 and 3,902,734. According to this process, the support undergoes a dipping or electrolytic treatment with an aqueous solution of sodium silicate. In addition, there can be adopted the treatment with potassium fluorozirconate as disclosed in JP-B-36-22063 and the treatment with polyvinylphosphonic acid as disclosed in U.S. Pat. Nos. 3,276,868, 4,153,461 and 4,689,272.

In the image recording materials of the present invention, a positive working photosensitive composition is coated on a support and, if desired, a subbing (or undercoat) layer may be provided between the support and the photosensitive composition layer and a mat layer may be provided on the photosensitive composition layer.

As a constituent of the subbing layer, various organic compounds can be used, including, e.g., carboxymethyl cellulose, dextrin, gum arabic, amino group-containing phosphonic acids such as 2-aminoethylphosphonic acid, organic phosphonic acids such as optionally substituted phenylphosphonic acids, naphthylphosphonic acids, alkylphosphonic acids, glycerophosphonic acids, methylenediphosphonic acid and ethylenediphosphonic acid, organic phosphates such as optionally substituted phenyl phosphates, naphthyl phosphates, alkyl phosphates and glyceryl phosphates, organic phosphinic acids such as optionally substituted phenylphosphinic acids, naphthylphosphinic acids, alkylphosphinic acids and glycerophosphinic acids, amino acids such as glycine and β-alanine, and hydrochlorides of hydroxy group-containing amines such as triethanolamine hydrochloride. The constituent may be a mixture of two or more of the compounds cited above.

The organic subbing layer can be provided in a manner as described below: The organic compound as cited above is dissolved in water, an organic solvent such as methanol, ethanol, methyl ethyl ketone, etc. or a mixture thereof, applied to an aluminum plate and then dried to form the organic subbing layer; or an aluminum plate is dipped in a solution prepared by dissolving the organic compound as cited above in water, an organic solvent such as methanol, ethanol, methyl ethyl ketone, etc. or a mixture thereof, thereby adsorbing the organic compound onto the aluminum plate, and then washed with water or the like, and further dried to from the organic subbing layer. In the former manner, the solution used has the organic compound concentration ranging from 0.005 to 10% by weight and can be applied using various methods. In the latter manner, on the other hand, the concentration of the solution is in the range of 0.01 to 20% by weight, preferably 0.05 to 5% by weight, the dipping temperature ranges from 20° C. to 90° C., preferably from 25° C. to 50° C., and the dipping time ranges from 0.1 second to 20 minutes, preferably from 2 seconds to 1 minute. The pH of the solution used therein can be adjusted within the range of 1 to 12 by using a basic substance such as ammonia, triethylamine, potassium hydroxide, etc. and an acidic substance such as hydrochloric acid, phosphoric acid, etc. Further, the solution can contain yellow dyes for the purpose of improving tone reproduction of the image recording materials.

The coverage rate of the organic subbing layer is appropriately in the range of 2 to 200 mg/m$^2$, and preferably in the range of 5 to 100 mg/m$^2$. When the coverage rate is less than 2 mg/m$^2$, sufficient long press life cannot be attained. Also a coverage rate greater than 200 mg/m$^2$ has the same disadvantage.

Further, for the purpose of preventing scratches and adhesion troubles from generating, a mat layer can be provided on the surface of the positive photosensitive composition layer according to the present invention. The mat layer is formed using the method as disclosed in JP-A-50-125805, JP-B-57-6582 and JP-B-61-28986, or the method of heat-depositing a solid powder as disclosed in JP-B-62-62337.

It is desirable for the average diameter of powders used in the mat layer used in the present invention to be not greater than 100 μm, preferably in the range of 2 to 8 μm. A too great average diameter is undesirable in view of tone reproduction because fine lines are difficult to form and highlight dots decrease in number. On the other hand, an average diameter less than 2 μm is also undesirable in view of a tendency to get scratches and the like. The coverage rate of the mat layer is desirably in the range of 5 to 200 mg/m$^2$, and more desirably in the range of 20 to 150 mg/m$^2$. The coverage rates beyond that range may cause scratches, while those below that range are undesirable in view of adhesion troubles.

The thus prepared positive working image-recording materials are, in general, subjected to imagewise exposure and development-processing.

As for the light source of active rays used for the imagewise exposure, there includes, e.g., a mercury lamp, a metal halide lamp, a xenon lamp, a chemical lamp, a carbon arc lamp. As for the radiation usable in the present invention, there include, e.g., electron beams, X-rays, ion beams, far infrared rays. In addition thereto, g-line, i-line, Deep-UV and high-density energy beams (laser beams) can also be used. As specific examples of laser beams, mention may be made of, e.g., He—Ne laser, Ar laser, Kr laser, He—Cd laser, KrF excimer laser.

In the present invention, the light source capable of emitting light of wavelengths extending from near infrared to infrared region is preferable with a solid laser and a semiconductor laser being particularly preferred.

With respect to the developer and the replenisher used for the present image recording materials, hitherto known aqueous solutions of alkalis can be used. Specific examples of alkalis which can be used herein include, e.g., inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide, lithium hydroxide; and organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine. These alkali agents can be used alone or as a mixture of two or more thereof.

Of aqueous solutions containing those alkali agents, aqueous solutions of silicates, such as sodium silicate, potassium silicate, etc., are particularly preferred as developer. This is because the developing capacity can be controlled by properly choosing the ratio and the concentration between the silicate constituents, silicon dioxide $SiO_2$ and an alkali metal oxide $M_2O$. For instance, the alkali metal silicates disclosed in JP-A-54-62004 and JP-B-57-7427 are used to advantage.

In the case of performing the development with an automatic developing machine, it is known that a great deal of PS (presensitized) plates can be processed by adding to a developer an aqueous solution (replenisher) whose alkalinity is higher than that of the developer without exchanging the developer in a developing tank for fresh one for a long time. This replenishing method can be adopted in the present invention also.

To the developer and the replenisher, various surfactants and organic solvents can be added, if desired, for the purposes of promoting or retarding the development, dispersing development scum and enhancing the ink receptivity of a printing plate in the image area. Suitable surfactants include anionic, cationic, nonionic and amphoteric ones.

Further, reducing agents such as hydroquinone, resorcinol, sodium and potassium salts of inorganic acids (e.g., sulfurous acid, hydrogensulfurous acid), etc., organic carboxylic acids, defoamers and water softeners can be optionally added to the developer and the replenisher.

The printing plate development-processed with the foregoing developer and replenisher undergoes after-treatments with wash water, a rinsing solution containing a surfactant and so on, a desensitizing solution containing gum arabic or/and a starch derivative, and so on. In using the present image recording materials as printing plates, various combinations of those treatments can be adopted as the after-treatment.

In recent years, automatic developing machines for printing plates have been prevailingly used in the field of platemaking and graphic arts for rationalization and standardization of platemaking operations. Such an automatic developing machine is generally constituted of a development part and an after-treatment part, and equipped with a device for transportation of a printing plate, various processing tanks and a device to spray each processing solution. In the development part, while the exposed printing plate is being transported horizontally, the processing solutions pumped up are sprayed one after another out of their respective spray nozzles onto the printing plate. Recently, there has been known another method in which a printing plate is soaked in various processing solutions in succession while it is being transported from one processing tank filled with a processing solution to another by means of guide rolls arranged in every processing solution. In the automatic processing as described above, each processing can be continued as each processing solution in replenished with a replenisher in an amount depending on the processed area, the working time and so on.

Also, there can be adopted a processing method in which any replenishers are not used in a substantial sense, that is, each processing solution is used to the full and then discarded.

The case in which the present image recording materials are used as photosensitive planographic printing plates is outlined below. When an unnecessary image area (e.g., the traces of film edges of an original film) is present in a planographic plate obtained by performing imagewise exposure, development, and washing and/or rinsing, and/or gumming-up operations, the unnecessary image area is eliminated. The elimination can be preferably carried out by coating an eliminating solution as disclosed, e.g., in JP-B-2-13293 on the unnecessary image area, allowing the solution coated to stand for a prescribed time as it is and then by washing it out. In addition, there can be used the method disclosed in JP-A-59-174842 which comprises irradiating the unnecessary image area with active rays conducted by means of optical fibers and developing the irradiated area.

The thus obtained planographic printing plate is coated with desensitizing gum, if desired, and then conducted to a printing process. Prior to the printing process, however, the plate should be subjected to a burning-in treatment if much higher impression capacity is required of the planographic printing plate.

When the planographic printing plate is subjected to the burning-in treatment, it is desirable that in advance of burning-in the plate be treated with a burning conditioner as disclosed in JP-B-61-2518, JP-B-55-28062, JP-A-62-31859 and JP-A-61-159655.

As for the manner of treating, a burning conditioner is applied to the planographic printing plate, e.g., by using a sponge or absorbent cotton wadding impregnated with the burning conditioner, by dipping the plate in a vat filled with the burning conditioner or by using an automatic coater. A more desirable result can be obtained if the burning conditioner applied is evened up with a squeegee or squeegee roller.

An appropriate coverage rate of the burning conditioner is generally in the range of 0.03 to 0.8 g/m² (in terms of a dry weight).

After the burning conditioner-coated planographic printing plate is dried, if needed, it is heated up to a high temperature by means of a burning processor (e.g., Burning Processor BP-1300, sold by Fuji Photo Film, Co., Ltd.). In this case, suitable heating temperature and time, though they depend on what kind of component forms the image, are in the range of 180° to 300° C. and in the range of 1 to 20 minutes, respectively.

The planographic printing plate which has undergone the burning-in treatment can be further subjected to conventional treatments, such as washing, gumming, etc., if desired. In the case where the burning conditioner used contains a water-soluble high molecular weight compound or the like, the so-called desensitization treatment, such as gumming, can be omitted.

The thus obtained planographic printing plate is installed in a offset press, and serves printing of a great number of sheets.

The present invention will be illustrated in more detail by references to the following examples, but it should not be construed as being limited to these examples.

EXAMPLE 1

A carbon black dispersion was prepared by dispersing the following composition with glass beads for 10 minutes:

| Carbon Black Dispersion | |
|---|---|
| Carbon Black | 1.0 pt. wt. |
| Benzylmethacrylate-methacrylic acid copolymer (molar ratio: 72/28, average molecular weight: 7 × 10⁴) | 1.6 pts. wt. |
| Cyclohexanone | 1.6 pts. wt. |
| Methoxypropyl acetate | 3.8 pts. wt. |

After a 0.30 mm-thick aluminum plate (JIS1050) was degreased by washing with trichloroethylene, the surface thereof was grained with a nylon brush and an aqueous suspension of 400 mesh pumice, and thoroughly rinsed with water. Then, the plate was etched by dipping in a 25% aqueous NaOH kept at 45° C. for 9 seconds, and washed with water. Further, the etched plate was dipped in a 2% aqueous $HNO_3$ for 20 seconds, and washed with water. Therein, the grained surface was etched in an amount of about 3 g/m². Furthermore, the plate was subjected to the direct-current anodizing treatment using a 7% aqueous $H_2SO_4$ as an electrolyte under a current density of 15 A/dm², thereby forming an anodized film of 3.0 g/m². The resulting plate was washed and dried to prepare a base plate. Then, the following undercoat solution was applied on the base plate, and dried at 80° C. for 30 seconds. The dry coverage of the undercoat was 10 mg/m².

| Undercoat Solution | |
|---|---|
| β-Alanine | 0.1 g |
| Phenylsulfonic acid | 0.05 g |
| Methanol | 40 g |
| Purified water | 60 g |

The thus treated aluminum plate was further coated with the following photosensitive solution, and dried at 100° C. for 2 minutes to obtain a positive working photosensitive planographic printing plate. The dry coverage was 2.0 g/m².

| Photosensitive Solution | |
|---|---|
| Esterification product of naphthoquinone-1,2-diazido-5-sulfonyl chloride and pyrogallol-acetone resin (the same as described in Example 1 of U.S. Pat. No. 3,635,709) | 0.90 g |
| Cresol-formaldehyde novolak resin (meta/para ratio = 6/4, weight average molecular weight: 1,800, unreacted cresol content: 0.5%) | 2.00 g |
| p-Octylphenol-formaldehyde novolak resin | 0.02 g |
| Naphthoquinone-1,2-diazido-4-sulfonyl chloride | 0.01 g |
| Tetrahydrophthalic anhydride | 0.05 g |
| 4-(p-N,N-bis(ethoxycarbonylmethyl)-aminophenyl)-2,6-bis(trichloromethyl)-s-triazine | 0.02 g |
| 4-(p-N-(p-hydroxybenzoyl)amino-phenyl)-2,6-bis-(trichloromethyl)-s-triazine | 0.02 g |
| Victoria Pure Blue BOH using 1-naphthalene-sulfonate ion as a counter ion | 0.03 g |
| Carbon black dispersion described above | 1.02 g |
| Megafac F-177 (fluorine-containing surfactant, produced by Dainippon Ink & Chemicals, Inc.) | 0.06 g |
| Methyl ethyl ketone | 20 g |
| Methyl alcohol | 7 g |

The positive working photosensitive planographic printing plate thus obtained was exposed to YAG laser the power of which was controlled so as to be 2 W on the plate surface, and then processed with an automatic developing machine in which the developer and the rinsing solution produced by Fuji Photo Film Co., Ltd., DP-4 (1:8) and FR-3 (1:7), respectively, were used. Further, the plate surface was subjected to gumming with GU-7 (1:1) produced by Fuji Photo Film Co., Ltd., and allowed to stand for 1 day. The thus made printing plate was installed in a printing press, Heidel KOR-D, and printing was carried out. With the result that the image strength in the image area was increased and the developability in the non-image area was heightened, scumming-free satisfactory prints were obtained.

COMPARATIVE EXAMPLE 1

A positive working photosensitive planographic printing plate was produced in the same manner as in Example 1, except that the esterification product of naphthoquinone-1,2-diazido-5-sulfonyl chloride and pyrogallol-acetone resin and naphthoquinone-1,2-diazido-4-sulfonyl chloride were removed from the photosensitive solution. The plate obtained was subjected to the same exposure and development as in Example 1 to result in the formation of only a faint image having a small difference in density between the image area and the non-image area. The printing was carried out using this plate in the same manner as in Example 1, but all the prints obtained had scum.

EXAMPLE 2

The surface of a 0.30 mm-thick aluminum plate was grained using a nylon brush and an aqueous suspension of 400 mesh pumice, and thoroughly rinsed with water. Further, the plate was etched by dipping in 10% aqueous NaOH kept at 70° C. for 60 seconds, washed with running water, rinsed with 20% aqueous $HNO_3$ for neutralization, and then rinsed with water. Then, the plate surface was electrolytically roughened in a 1% aqueous solution of nitric acid using a sine wave alternating electric current in an electricity quantity of 160 coulomb/$dm^2$ at the anode under the condition of $V_A$=12.7 V. The thus roughened surface had a roughness of 0.6 μm (in terms of Ra). Subsequently thereto, the plate was soaked for 2 min. in 30% aqueous $H_2SO_4$ kept at 55° C. in order to desmut, and then anodized under a current density of 2 A/$dm^2$ in a 20% aqueous solution of sulfuric acid so as to be have an thickness of 2.7 g/$m^2$.

A photosensitive solution was prepared according to the following composition, and applied on the anodized aluminum plate, and dried at 100° C. for 2 minutes to provide a photosensitive planographic printing plate. The coverage of the photosensitive solution was 2.5 g/$m^2$ in terms of a dry weight.

| Photosensitive Solution | |
|---|---|
| Esterification product of naphthoquinone-1,2-diazido-5-sulfonyl chloride and pyrogallol-acetone resin (the same as described in Example 1 of U.S. Pat. No. 3,635,709) | 0.45 g |
| Polyurethane synthesized from 4,4'-diphenylmethane-diisocyanate and 2,2-bis(hydroxymethyl)propionic acid (the same as described in Synthesis Example 1 of JP-A-63-124047) | 0.30 g |
| Cresol-formaldehyde novolak resin | 0.80 g |
| 2-(p-Methoxyphenyl)-4,6-bis(trichloromethyl)-s-triazine | 0.02 g |
| Oil Blue #603 (produced by Orient Chemical Industry Co., Ltd.) | 0.01 g |
| Carbon black dispersion (the same as used in Example 1) | 0.62 g |
| Megafac F-177 (fluorine-containing surfactant, produced by Dainippon Ink & Chemicals, Inc.) | 0.06 g |
| Ethylene dichloride | 10 g |
| Methyl cellosolve | 10 g |

The positive working photosensitive planographic printing plate thus obtained was exposed to YAG laser the power of which was controlled so as to be 2 W on the plate surface, and then underwent dip development at 25° C. for 60 seconds with a developer prepared by diluting DP-4 (trade name, a product of Fuji Photo Film Co., Ltd.) with water to the 1/8 concentration.

The resulting planographic printing plate was installed in a printing press, Model KOR, made by Heidelberg A.G., and printing was carried out on wood free paper with commercially available ink. With the result that the durability in the image area was increased, the final number of printed sheets was 65,000, and so it can be said that the plate had sufficiently long press life.

COMPARATIVE EXAMPLE 2

A positive working photosensitive planographic printing plate was produced in the same manner as in Example 2, except that the esterification product of naphthoquinone-1,2-diazido-5-sulfonyl chloride and pyrogallol-acetone resin was removed from the photosensitive solution. The plate obtained was subjected to the same exposure and development as in Example 2 to result in the formation of only a faint image having a small difference in density between the image area and the non-image area. The printing was carried out using this plate in the same manner as in Example 2. However, only a small number of scummy prints were obtained.

EXAMPLE 3

The following photosensitive solution was applied to the same anodized aluminum plate as used in Example 2, and dried at 100° C. for 2 minutes, thereby producing a photosensitive planographic printing plate. The coverage of the photosensitive solution was 2.5 g/$m^2$ in terms of a dry weight.

| Photosensitive Solution | |
|---|---|
| Esterification product of naphthoquinone-1,2-diazido-5-sulfonyl chloride and pyrogallol-acetone resin (the same as described in Example 1 of U.S. Pat. No. 3,635,709) | 0.45 g |
| N-(p-Aminosulfonylphenyl)methacrylamine-methyl-methacrylate copolymer (the same as described in Synthesis Example 1 of EP-A2-0330239 | 1.10 g |
| 2-(p-Methoxyphenyl)-4,6-bis(trichloromethyl)-s-triazine | 0.02 g |
| Oil Blue #603 (produced by Orient Chemical Industry Co., Ltd.) | 0.01 g |
| Carbon black dispersion (the same as used in Example 1) | 0.62 g |
| Megafac F-177 (fluorine-containing surfactant, produced by Dainippon Ink & Chemicals, Inc.) | 0.06 g |
| Ethylene dichloride | 10 g |
| Methyl cellosolve | 10 g |

The positive working photosensitive planographic printing plate thus obtained was exposed to YAG laser the power of which was controlled so as to be 2 W on the plate surface, and then underwent dip development at 25° C. for 60 seconds with a developer prepared by diluting DP-4 (trade name, a product of Fuji Photo Film Co., Ltd.) with water to the 1/8 concentration.

The resulting planographic printing plate was installed in a printing press, Model KOR, made by Heidelberg A.G., and printing was carried out on wood free paper sheets with commercially produced general ink and UV ink, thereby observing for the final number of printed sheets. With the result that the durability in the image area was improved, the final number of printed sheets was 60,000 in case of ordinary ink, while it was 30,000 in case of UV ink. Thus, it can be said that the plate had sufficiently long press life.

EXAMPLE 4

The surface of a 0.24 mm-thick aluminum plate (JIS A 1050) underwent a brush graining treatment using a rotating nylon brush as an aqueous suspension of pumice having an average particle size of about 21 μm was supplied onto the plate surface, and thoroughly rinsed with water. Further, the plate was etched by dipping in 10% aqueous NaOH kept at 50° C. for 10 seconds, washed with running water, rinsed with 20% aqueous $HNO_3$ for neutralization, and then rinsed with water. Then, the plate surface was electrolytically roughened in a 1% aqueous solution of nitric acid using a sine wave alternating electric current in an electricity quantity of 160 coulomb/$dm^2$ at the anode under the condition of $V_A$=12.7 V. The thus roughened surface had a roughness of 0.6 μm (in terms of Ra). Subsequently thereto, the plate was soaked for 2 min. in 30% aqueous $H_2SO_4$ kept at 55° C. in order to desmut, and then anodized under a current density of 2 A/dm² in a 20% aqueous $H_2SO_4$ so as to have a thickness of 2.7 g/m², thereby preparing a base plate.

To the thus treated base plate was applied the following undercoat solution, followed by drying at 80° C. for 30 seconds. The dry coverage of the undercoat was 30 mg/m².

| Undercoat Solution | |
| --- | --- |
| Aminoethylphosphonic acid | 0.1 g |
| β-Alanine | 0.1 g |
| Phenylphosphonic acid | 0.15 g |
| Methanol | 40 g |
| Purified water | 60 g |

The resulting aluminum plate was further coated with the following photosensitive solution, and dried at 100° C. for 2 minutes to obtain a positive working photosensitive planographic printing plate. The dry coverage was 1.5 g/m².

| Photosensitive Solution | |
| --- | --- |
| Cresol-formaldehyde novolak resin (meta/para ratio = 6/4, weight average molecular weight: 1,100, unreacted cresol content: 0.5%) | 2.00 g |
| 2,5-Dibutoxy-4-morpholino-benzenediazonium hexafluorophosphate | 0.29 g |
| Tetrahydrophthalic anhydride | 0.05 g |
| 4-(p-N,N-bis(ethoxycarbonylmethyl)-aminophenyl)-2,6-bis(trichloromethyl)-s-triazine | 0.02 g |
| Phosphorous acid | 0.01 g |
| Oil Blue #603 (produced by Orient Chemical Industry Co., Ltd.) | 0.01 g |
| Carbon black dispersion (the same as used in Example 1) | 0.62 g |
| Megafac F-177 (fluorine-containing surfactant, produced by Dainippon Ink & Chemicals, Inc.) | 0.02 g |
| Methyl ethyl ketone | 15 g |
| 1-Methoxy-2-propanol | 10 g |

Onto the photosensitive layer thus coated, an aqueous solution of methylmethacrylate/ethylacrylate/sodium acrylate (68/20/12) copolymer was electrostatically sprayed in accordance with the method as described in Example 1 of JP-B-61-28986, thereby forming a mat layer.

The positive working photosensitive planographic printing plate thus obtained was exposed to YAG laser the power of which was controlled so as to be 2 W on the plate surface, and then underwent dip development at 25° C. for 60 seconds with a developer prepared by diluting DP-4 (trade name, a product of Fuji Photo Film Co., Ltd.) with water to the 1/8 concentration.

Thereafter, the resulting plate surface was wiped with a burning conditioner, BC-3 (trade name, a product of Fuji Photo Film Co., Ltd.), and then heated for 7 minutes at 260° C. by means of a burning apparatus, BP-1300 (made by Fuji Photo Film Co., Ltd.). After the plate cooled down, the plate surface was treated with a gumming solution prepared by diluting Gum GU-7 (trade name, the product of Fuji Photo Film Co., Ltd.) with water to the 1/2 concentration.

This planographic printing plate was allowed to stand for 1 day, and then installed in a printing press, Heidelberg KOR-D, thereby performing the printing. As a result of achievement of increased durability in the image area, good prints of high ink density were obtained.

EXAMPLE 5

A positive working photosensitive planographic printing plate was obtained in the same manner as in Example 3, except that the carbon black dispersion used in Example 3 was replaced by the following dye:
Dye
2,6-Di-t-butyl-4-{5-(2,6-di-t-butyl-4H-thiopyran-4-ylidene)-penta-1,3-dienyl}thiopyrylium tetrafluoroborate (the compound disclosed in U.S. Pat. No. 4,283,475) 0.01422 g The positive working photosensitive planographic printing plate obtained was exposed to semiconductor laser (wavelength: 825 nm, beam diameter: $1/e^2$=11.9μ) controlled so as to have the linear speed of 8 m/sec and the power of 110 mW at the plate surface. Then, it was subjected to the same development processing as in Example 3 to succeed in the formation of fine lines with a line width of 10 μm.

Next, the beam diameter was adjusted to 6μ ($1/e^2$) and the exposure similar to the above was carried out via a dot image of 200 lpi under the writing resolution of 4,000 dpi. Thereafter, the processing similar to the above was carried out to form a dot image.

The resulting planographic printing plate was installed in a printing press, Model KOR, made by Heidelberg A.G., and printing was carried out on wood free paper sheets with commercially available ink and UV ink. With the result that the durability in the image area was improved, the plate had sufficiently long press life, similarly to the plate obtained in Example 3.

EXAMPLE 6

The surface of a 0.24 mm-thick aluminum plate was grained with a nylon brush and a 400 mesh pumice-water suspension and then thoroughly rinsed with water, thereby preparing a base plate (I). The base plate (I) was etched by dipping in 10% aqueous NaOH kept at 70° C. for 20 seconds, washed with running water, rinsed with 20% aqueous $HNO_3$ for neutralization, and then rinsed with water. Further, the plate surface was electrolytically roughened in a 0.7% aqueous nitric acid solution using a sine wave alternating electric current in an electricity quantity of 400 coulomb/dm² under the condition of $V_A$=12.7 V, and then rinsed with water, thereby preparing a base plate (II).

The base plate (II) was treated in a 10% aqueous solution of NaOH so as to be dissolved at the surface in the amount of 0.9/m². After washing with water, the resulting plate was neutralized in a 20% nitric acid solution and rinsed, thereby desmutting the plate surface. Thereafter, the plate was anodized in 18% aqueous sulfuric acid so as to have an oxidized film thickness of 3 g/m².

Then, a photosensitive solution as described below was prepared, applied on the thus anodized plate and then dried at 100° C. for 2 minutes to provide a photosensitive planographic printing plate. The coverage of the photosensitive solution was 2.3 g/m² in terms of a dry weight.

| Photosensitive Solution | |
| --- | --- |
| Esterification product of 1,2,4-trihydroxybenzophenone and naphthoquinone-1,2-diazido-5-sulfonyl chloride (esterification degree: 90 mol%) | 0.45 g |
| N-(p-Aminosulfonylphenyl)methacrylamide/methylmethacrylate copolymer (the same as described in Example 1 of EP-A2-0330239) | 1.70 g |

-continued

| Photosensitive Solution | |
|---|---|
| Naphthalene-2-sulfonic acid | 0.007 g |
| Cresol-formaldehyde resin (meta/para ratio = 6/4, weight average molecular weight: 4,000) | 0.70 g |
| 2-(p-methoxyphenyl)-4,6-bis(trichloromethyl)-s-triazine | 0.02 g |
| Naphthoquinone-1,2-diazido-sulfonyl chloride | 0.01 g |
| Victoria Pure Blue BOH (a dye produced by Hodogaya Chemical Co., Ltd.) | 0.015 g |
| Carbon black dispersion (the same as used in Example 1) | 1.02 g |
| Megafac F-177 (fluorine-containing surfactant, produced by Dainippon Ink & Chemicals, Inc.) | 0.004 g |
| Dimethylformamide | 4 g |
| 1-Methoxy-2-propanol | 9 g |
| Methyl ethyl ketone | 7 g |

The positive working photosensitive planographic printing plate thus obtained was exposed to YAG laser the power of which was controlled so as to be 2 W on the plate surface, and then underwent dip development at 25° C. for 60 minutes with a developer prepared by diluting DP-4 (trade name, a product of Fuji Photo Film Co., Ltd.) to the 1/8 concentration.

The deletion speed of the thus obtained planographic printing plate was measured with a delation fluid, PR-1 (trade name, a product of Fuji Photo Film Co., Ltd.), and it was found to be 10 seconds. This value signifies that the plate was efficiently deleted. In addition, high impression capacity such as 45,000 sheets in the case of using UV ink and 90,000 sheets in the case of using oil ink was achieved because the durability in the image area was improved. Moreover, this planographic printing plate had high resistance to a cleaning solution for UV ink and an enlarged difference in developability between the image area and the non-image area. As a result thereof, the plate showed excellent processability even when the exhausted developer inferior in activity was used.

Accordingly, the present invention is advantageous in that conventional processing and printing apparatuses can be used therein as they are and the image recording materials provided thereby can have excellent recording properties and sufficiently long press life and enable the direct plate-making from digital data sent by computers and the like.

While the invention has been described in detail and with reference to specific examples thereof, it will be apparent to one of ordinary skill in the art that various changes and modifications can be made herein without departing from the spirit and scope of the invention.

What is claimed is:

1. A method for forming a positive working printing plate which consists essentially of imagewise exposing and alkali development-processing an image recording material comprising a water-insoluble, alkaline water-soluble resin as a binder, a substance capable of generating heat by the absorption of light which is carbon black, and a heat decomposable substance capable of substantially lowering the solubility of the binder when the substance is in an undecomposed state, wherein the printing plate is formed by direct-platemaking the image recording material from digital data of a computer using a light source having emission wavelengths in the region of from near infrared to infrared rays.

2. A method of forming a positive working printing plate which consists essentially of imagewise exposing and alkali development-processing an image recording material comprising a support having thereon a layer comprising a water-insoluble, alkaline water-soluble resin as a binder, a substance capable of generating heat by the absorption of infrared rays or near infrared rays which is carbon black, and a heat decomposable substance capable of substantially lowering the solubility of the binder when the substance is in an undecomposed state, wherein the printing plate is formed by direct-platemaking the image recording material from digital data of a computer using a light source having emission wavelengths in the region of from near infrared to infrared rays.

3. A method as claimed in claim 2, wherein the binder is an alkali-soluble resin.

4. A method as claimed in claim 2, wherein the binder is a phenol resin.

5. A method as claimed in claim 2, wherein the binder is an acrylic resin.

6. A method as claimed in claim 2, wherein the binder is a polyurethane resin.

7. A method as claimed in claim 2, wherein the heat decomposable substance capable of substantially lowering the solubility of the binder when the substance is in an undecomposed state is an onium salt.

8. A method as claimed in claim 2, wherein the heat decomposable substance capable of substantially lowering the solubility of the binder when the substance is in an undecomposed state is a diazonium salt.

9. A method as claimed in claim 2, wherein the heat decomposable substance capable of lowering the solubility of the binder when the substance is in an undecomposed state is a quinonediazide compound added in an amount of from 1 to 50% by weight, based on the whole solid content in the layer comprising the binder, the substance capable of generating heat, and the heat decomposable substance.

10. A method as claimed in claim 2, wherein the support is a polyester film.

11. A method as claimed in claim 2, wherein the support is an aluminum plate.

* * * * *